United States Patent
Jasa et al.

(10) Patent No.: US 7,542,533 B2
(45) Date of Patent: Jun. 2, 2009

(54) APPARATUS AND METHOD FOR CALIBRATING THE FREQUENCY OF A CLOCK AND DATA RECOVERY CIRCUIT

(75) Inventors: Hrvoje Jasa, Scarborough, ME (US); Gary D. Polhemus, Sebago, ME (US); Kenneth P. Snowdon, Falmouth, ME (US)

(73) Assignee: Agere Systems Inc., Allentown, PA (US)

( * ) Notice: Subject to any disclaimer, the term of this patent is extended or adjusted under 35 U.S.C. 154(b) by 643 days.

(21) Appl. No.: 11/176,444

(22) Filed: Jul. 7, 2005

(65) Prior Publication Data

US 2007/0009072 A1    Jan. 11, 2007

(51) Int. Cl.
*H04L 7/00* (2006.01)

(52) U.S. Cl. ............... 375/354; 375/316; 375/295; 375/219; 327/165; 327/166; 327/176; 370/395.62; 398/155; 714/20

(58) Field of Classification Search ................ 375/354, 375/316, 295, 219; 327/165, 166, 176; 370/395.62; 398/155; 714/20
See application file for complete search history.

(56) References Cited

U.S. PATENT DOCUMENTS

| 5,237,290 | A | 8/1993 | Banu et al. |
| 5,834,980 | A | 11/1998 | Pitio et al. |
| 6,377,082 | B1 | 4/2002 | Loinaz et al. |
| 2004/0052316 | A1 * | 3/2004 | Choi et al. ............... 375/326 |
| 2006/0031701 | A1 * | 2/2006 | Nam et al. ............... 713/500 |
| 2006/0115035 | A1 * | 6/2006 | Yu et al. ............... 375/376 |

* cited by examiner

*Primary Examiner*—David C Payne
*Assistant Examiner*—Zewdu Kassa

(57) ABSTRACT

Embodiments of the invention include an apparatus and method for continuously calibrating the frequency of a clock and data recovery (CDR) circuit. The apparatus includes a delay arrangement that generates a gating signal, and a gated voltage-controlled oscillator that is enabled by the gating signal. The gated voltage-controlled oscillator generates a recovered clock signal that is based on the data signal input to the CDR circuit. The apparatus also includes a frequency control loop that continuously calibrates the gated voltage-controlled oscillator in such a way that the frequency of the clock signal generated by the gated voltage-controlled oscillator continues to be one half of the period of the data bits in the input data signal and the clock signal remains synchronized to the center of the data state transitions of the input data signal. Alternatively, a secondary frequency control loop adjusts the amount of delay in the frequency control loop.

21 Claims, 3 Drawing Sheets

| A | B | Y | $Y_b$ |
|---|---|---|---|
| 0 | 0 | 0 | 1 |
| 0 | 1 | 0 | 1 |
| 1 | 0 | 0 | 1 |
| 1 | 1 | 1 | 1 |

APPARATUS AND METHOD FOR CALIBRATING THE FREQUENCY OF A CLOCK AND DATA RECOVERY CIRCUIT

BACKGROUND OF THE INVENTION

1. Field of the Invention

The invention relates to clock and data recovery circuits. More particularly, the invention relates to frequency calibration of clock and data recovery circuits, such as burst mode clock and data recovery circuits.

2. Description of the Related Art

A clock and data recovery (CDR) circuit is a circuit that generates a periodic clock signal, or clock, that is synchronized with respect to an incoming data signal. CDR circuits often are used in communication systems to synchronize the phase relationship of the system's receiver to the incoming signal from the system's transmitter. One type of conventional clock recovery method recovers the phase of the incoming signals directly from information contained within the incoming signals themselves. Such clock recovery method can be achieved using either an open-loop configuration or a closed-loop configuration.

A burst mode CDR circuit is a circuit or circuit element that synchronizes or recovers timing information from a burst of formatted data applied or input to the CDR circuit. Conventional data formats include, e.g., the non-return-to-zero (NRZ) format, in which a "1" represents a logical high level or state and a "0" represents a logical low level or state. Such data format is compared with, e.g., the non-return-to-zero inverse (NRZI) format, in which a "1" represents a data state transition and a "0" represents the lack of a data state transition.

Many conventional CDR circuits use at least one gated oscillator, which is triggered by incoming data transitions, to create a local retiming clock that is synchronized to the incoming data signal. Such gated oscillator approach, in general, improves the circuit's performance with data signals that have relatively long strings of consecutive identical digits (CID), and generally requires less power and circuit area compared to other approaches, such as slaved oscillator approaches. For example, U.S. Pat. No. 5,237,290 tunes the gated oscillators using a slave circuit locked to a reference with a phase-locked loop (PLL), which generates a clock that has a constant phase relationship with a periodic input signal. However, physical differences in the circuits can cause the oscillator to run at different frequencies. Such frequency differences can reduce the system tolerance to CID data patterns.

Another gated oscillator CDR circuit, U.S. Pat. No. 5,834,980, makes use of a plurality of gated oscillators. In this configuration, one set of oscillators are being frequency calibrated while the other set of oscillators are active in the CDR circuit. Another CDR circuit configuration, U.S. Pat. No. 6,377,082, enhances the configuration disclosed in U.S. Pat. No. 5,834,980 by using a more digital approach to tune out frequency differences. However, both configurations add considerable circuit area to the overall CDR circuit.

Accordingly, it would be desirable to have a gated oscillator CDR circuit, suitable for use with relative significant CID data, that overcomes frequency mismatch problems, and yet requires less active circuitry than conventional arrangements.

SUMMARY OF THE INVENTION

The invention is embodied in an integrated circuit including a clock and data recovery (CDR) circuit in which the frequency of the CDR circuit is calibrated continuously. The apparatus, which recovers a clock signal that is based on the data signal input to the CDR circuit, includes a delay arrangement that generates a gating signal based on the input data signal and a delayed version of the input data signal. The apparatus also includes a gated voltage-controlled oscillator that, when enabled by the gating signal, generates the recovered clock signal having a duration that is one half of the period of the data bits in the input data signal and synchronized to the center of the data state transitions of the input data signal. The apparatus also includes a frequency control loop that continually calibrates the gated voltage-controlled oscillator in such a way that the frequency of the clock signal generated by the gated voltage-controlled oscillator continues to be one half of the period of the data bits in the input data signal and the clock signal remains synchronized to the center of the data state transitions of the input data signal.

BRIEF DESCRIPTION OF THE DRAWINGS

FIG. 3a is a simplified schematic diagram of the gated oscillator portion of the CDR circuit of FIG. 1; and FIG. 3b is a truth table diagram corresponding to the gated oscillator of FIG. 3a.

DETAILED DESCRIPTION OF EXEMPLARY EMBODIMENTS

Figure 1:
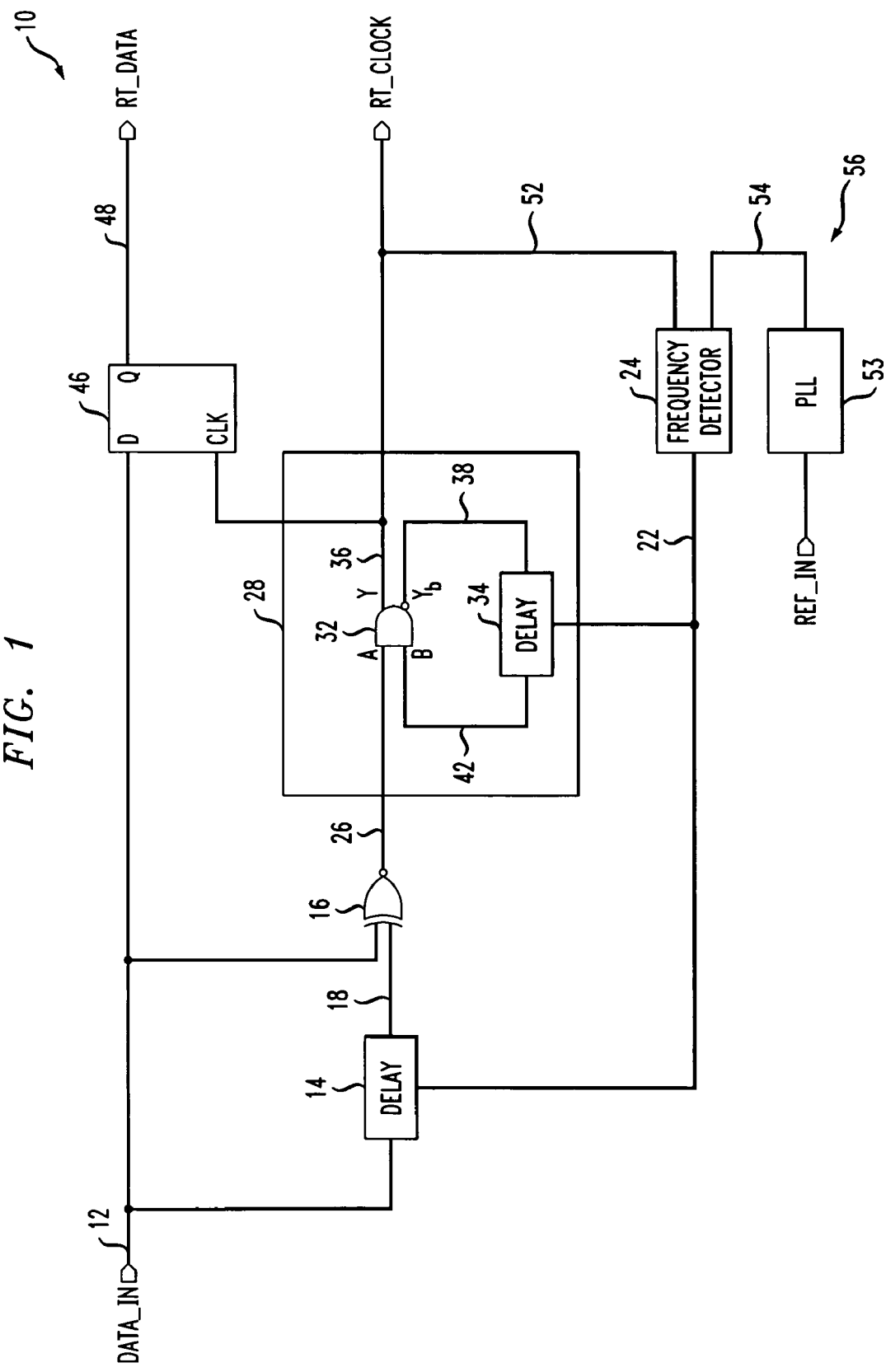
FIG. 1 is a simplified schematic diagram of a clock and data recovery (CDR) circuit according to embodiments of the invention.

In the following description, like reference numerals indicate like components to enhance the understanding of the invention through the description of the drawings. Also, although specific features, configurations and arrangements are discussed hereinbelow, it should be understood that such is done for illustrative purposes only. A person skilled in the relevant art will recognize that other steps, configurations and arrangements are useful without departing from the spirit and scope of the invention.

A clock and data recovery (CDR) circuit, such as a burst mode CDR circuit, typically uses a gated oscillator arrangement to create a retiming clock signal, or clock, that is synchronized with an incoming data signal. A gated oscillator is an oscillator that starts or stops oscillating by an enabling signal. In CDR circuits, the oscillation of the gated oscillator is triggered by the data transitions of the incoming data signal. However, many conventional CDR circuits of this type have difficulty generating a synchronized clock with incoming data signals that include relatively long strings of consecutive identical digits (CID).

Some conventional CDR circuits of this type use at least one ring-based voltage controlled oscillator (VCO), which has a relatively large frequency range of operation. However, in such arrangements, the control voltage to the VCO has to be set and held fixed for the VCO to run at the same frequency as the incoming data. To set the control voltage, typically, a preamble of data is used specifically for this purpose. Also, a phase-locked loop (PLL), with a second VCO running therein, is used to generate the control voltage to the main VCO. Such arrangement relies greatly on the physical matching of the VCO within the PLL to the main gated VCO. The closer the physical matching between the VCOs, the longer the run of consecutive identical digits within the incoming data the CDR circuit can tolerate. However, for data with relatively long runs of no data transitions, even VCOs that are relatively closely matched physically and electrically run at different frequencies, which causes possible loss of alignment between the recovered clock and the incoming data.

For example, the number of consecutive identical digits that a CDR circuit can tolerate is based on the frequency of the main gated VCO divided by 2 times the absolute value of the frequency difference between the main gated VCO and the VCO within the PLL. Thus, for a 3% physical difference between the VCOs, which is a relatively close physical matching for mass production of integrated circuits, the CID tolerance of the CDR circuit would be 1/(2*0.03)=16.67 bits. Such tolerance is not acceptable in current communications systems. For example, Synchronous Optical Network (SONET) system specifications require CID tolerance to be 72 bits.

Other conventional CDR circuits make use of gated VCOs either in or out of a PLL to calibrate the frequency of the main gated VCO. For example, in U.S. Pat. No. 6,377,082, a digital-to-analog converter (DAC) is used to set the voltage of the VCO in the PLL. This calibrated voltage is applied to the control input of the main gated VCO for frequency stability. However, as previously discussed, such arrangements often increase the amount of circuitry required for operation. The increased amount of circuitry increases the amount of circuit area needed on an integrated circuit, which is disadvantageous in the production of most integrated circuits.

According to embodiments of the invention, a clock and data recovery (CDR) circuit includes an oscillator, such as a gated voltage-controlled oscillator (VCO), that is configured in such a way that it is continually frequency tuned, thus reducing oscillator frequency mismatches. By reducing frequency mismatches, the inventive CDR circuit has an improved CID tolerance over conventional CDR circuit arrangements. Furthermore, the inventive CDR circuit has a configuration that reduces circuit area compared to conventional CDR circuits.

Referring now to FIG. 1, shown is a simplified schematic diagram of a clock and data recovery (CDR) circuit 10 according to embodiments of the invention. The CDR circuit 10 includes a data in line 12 for receiving an input data signal (e.g., DATA_IN). As discussed hereinabove, the input data signal may change data states at periodic intervals as defined by a clock signal, or clock, of known frequency, at a transmitter (not shown).

The data in line 12 inputs to a first delay arrangement, which is comprised of a first delay block or element 14 and an XNOR gate 16, connected as shown. More specifically, the data in line 12 inputs to the first delay block 14 and to a first input of the XNOR gate 16. The first delay block 14 has an output line 18 that inputs to a second input of the XNOR gate 16. Also, the first delay block 14 has a control input 22 that is controlled by a frequency detector 24. The control of the delay element is discussed in greater detail hereinbelow.

The XNOR gate 16 has an output line 26 that inputs to an oscillator, such as a gated voltage-controlled oscillator (VCO) 28. The gated VCO 28 includes a NAND/AND gate 32 and a second delay block or element 34. The XNOR gate output line 26 inputs to a first input of the NAND/AND gate 32, which is the gating or controlling input A of the gated VCO 28. A non-inverting output line 36 of the NAND/AND gate 32, which is the positive output Y of the gated VCO 28, represents the recovered clock (RT_CLOCK).

An inverting output line 38 of the NAND/AND gate 32, which is the negative output $Y_b$ of the gated VCO 28, inputs to the second delay block 34. An output line 42 of the second delay block 34 inputs to a second input B of the NAND/AND gate 32, forming a frequency control loop between the inverting output line 38 and the second input B of the NAND/AND gate 32. Also, the second delay block 34 is controlled by the frequency detector 24 via the control input 22.

The data in line 12 and the recovered clock (RT_CLOCK) from the positive output Y of the gated VCO 28 both input to a data extraction device 46, e.g., a master/slave D flip-flop. The data in line 12 inputs to a first (D) input of the flip-flop, and the recovered clock (RT_CLOCK) inputs to a second (CLK) input of the flip-flop. An output line 48 (Q or Q+) of the flip-flop represents the original input data signal 12 (DATA_IN).

The non-inverting output line 36 of the NAND/AND gate 32 (RT_CLOCK) also inputs to a first input of the frequency detector 24 (shown as line 52). The output of a phase-locked loop (PLL) 53 (shown as output line 54) inputs to a second input of the frequency detector 24. The PLL 53 includes a reference input line (REF_IN) from a stable reference. As will be discussed in greater detail hereinbelow, the frequency detector 24 and the PLL 53 form a secondary loop (shown generally as 56) that maintains the frequency calibration of the CDR circuit 10.

According to embodiments of the invention, the CDR circuit 10 is comprised of any suitable structure or arrangement, e.g., one or more integrated circuits. Alternatively, one or more of the components comprising the CDR circuit 10 is comprised of any suitable structure or arrangement, e.g., one or more integrated circuits. Also, alternatively, one or more of the elements comprising any one or more of the components comprising the CDR circuit 10 is comprised of any suitable structure or arrangement, e.g., one or more integrated circuits.

Also, according to embodiments of the invention, one or more of the components comprising the CDR circuit 10 are configured in such a way that the CDR circuit 10 supports single-ended signal flow and/or differential signal flow. Also, according to embodiments of the invention, all or a portion of the CDR circuit 10 is comprised of one or more complementary metal-oxide semiconductor (CMOS) devices or circuits.

In operation, the first delay block 14 delays the input data signal (DATA_IN) by time τ, which is equal to $T_{baud}/2$, where $T_{baud}$ is the period or duration of one data bit, i.e., the baud rate of the input data signal. The inputs to the XNOR gate 16 are the input data signal and the delayed version of the input data signal. The XNOR gate 16 creates a pulse of time τ for each rising or falling edge of the input data signal.

Figure 2:
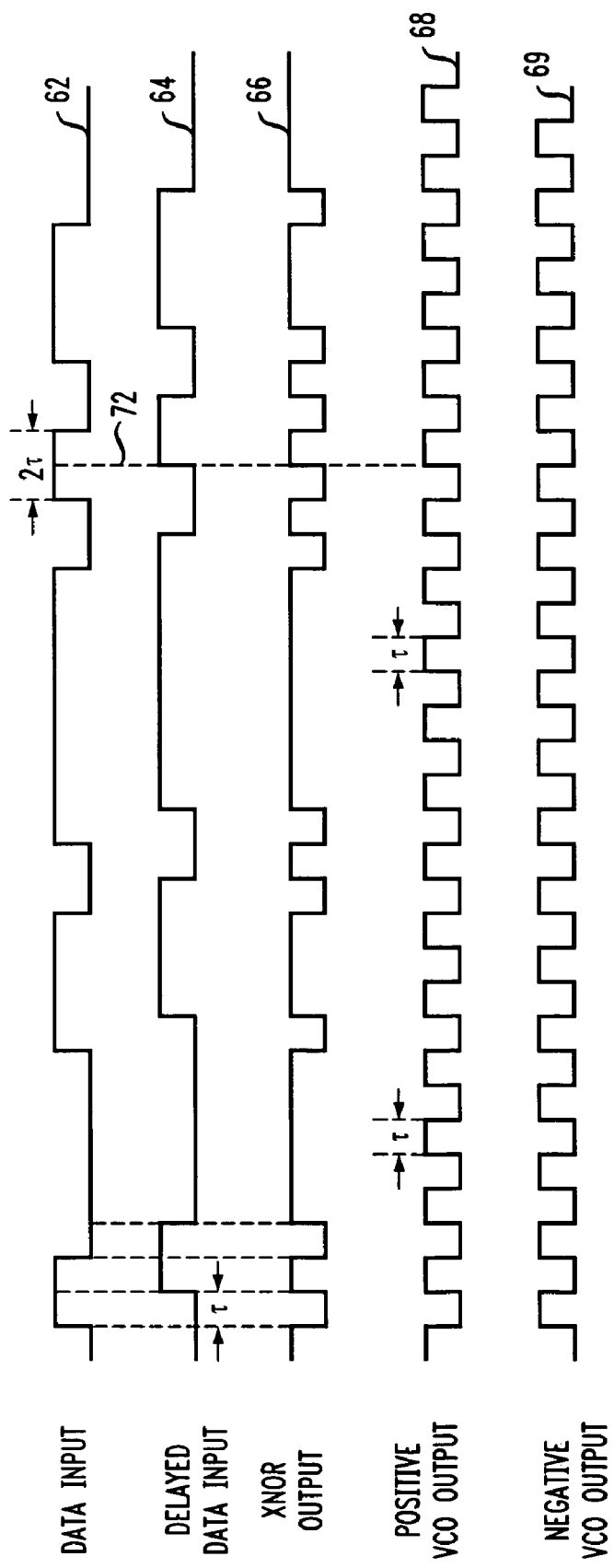
FIG. 2 is a timing diagram associated with the CDR circuit of FIG. 1.

Referring to FIG. 2, with continuing reference to FIG. 1, shown is a timing diagram of waveforms for various inputs and outputs of various components of the CDR circuit of FIG. 1. As shown, a first waveform 62 is a sample input data signal (DATA_IN) and a second waveform 64 is the delayed version of the sample input data signal. A third waveform 66 is the output of the XNOR gate 16, which creates a pulse of time τ for each rising or falling edge of the input data signal. According to embodiments of the invention, the output of the XNOR gate 16 is used as the gating or triggering signal for the gated VCO 28.

Figures 3A, 3B:
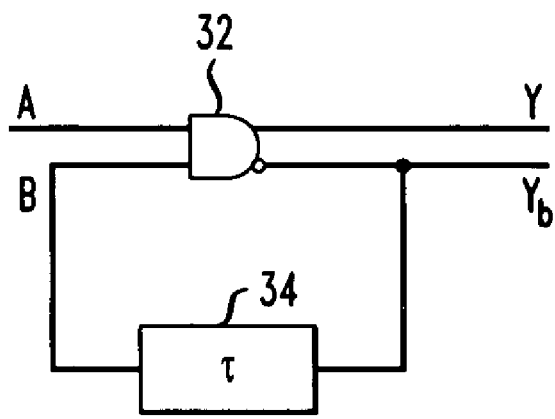

Referring now to FIGS. 3a-b, with continuing reference to FIGS. 1 and 2, shown is a simplified schematic diagram of the gated oscillator portion of the CDR circuit 10 of FIG. 1, and a truth table diagram corresponding to the gated oscillator of FIG. 3a. As discussed previously herein, the first input of the NAND/AND gate 32 (input A) is the gated or controlling input of the gated VCO 28. When the controlling input A is at a low state (e.g., a logical "0"), the non-inverting output line 36 of the NAND/AND gate 32 (the positive output Y of the gated VCO 28) is 0. Thus, the gated VCO 28 essentially is muted.

However, when the controlling input A is at a high state (e.g., a logical "1"), the positive output Y of the gated VCO 28 is at a low state when the second input of the NAND/AND gate 32 (input B) is at a low state and at a high state when input B is at a high state. As discussed previously herein, the input B is part of the frequency control loop that also includes the inverting output line 38 of the NAND/AND gate 32 (output $Y_b$) and the second delay element 34, which also has a delay time τ. Therefore, when the controlling input A is at a high state, the gated VCO 28 will toggle at a frequency based on the time τ of the second delay element 34, thus creating a clock having a frequency of ½τ.

The frequency detector 24 monitors the difference in frequency of the first input 52 (the recovered clock RT_CLOCK) and the second input 54 (the output of the PLL 53). The frequency detector 24 controls the first delay block 14 via the control input 22. As will be discussed in greater detail hereinbelow, control of the first delay block 14 by the frequency detector 24 causes the XNOR gate 16 to generate ½ bit pulses (i.e., pulses that have duration τ or $T_{baud}/2$) that work to keep the recovered clock RT_CLOCK remaining in the center of the data bit in the input data signal.

Also, as discussed, the frequency detector 24 controls the second delay block 34 via the control input 22, thus controlling the frequency of the gated VCO 28. More specifically, by controlling the second delay block 34, the frequency detector 24 causes the frequency of the gated VCO 28 to vary in a manner that is inversely proportional to the delay of the second delay block 34. That is, the longer the delay by the second delay block 34, the lower the frequency of the gated VCO 28.

When no data transitions are present in the input data signal (DATA_IN), the frequency detector 24 constantly monitors the frequency difference between the recovered clock RT_CLOCK and the output of the PLL 53. With the frequency detector 24 controlling the second delay block 34 delay based on this frequency difference and with the second delay block 34 being a part of the frequency control loop, the frequencies of the two signals (recovered clock RT_CLOCK and PLL output) are forced to be the same. That is, the frequency control loop, which includes the output $Y_b$ of the NAND/AND gate 32, the second delay element 34, and the input B of the NAND/AND gate 32, continually tunes the second delay block 34 in such a way that the frequency of the gated VCO 28 matches the frequency of the output of the PLL 53, which is locked in phase and frequency to REF_IN.

The CDR circuit 10 then provides the phase locking of the gated VCO 28 to the data transitions. Thus, the gated VCO 28 is tuned directly within the CDR circuit 10, without additional external VCOs or other tuning elements. Such arrangement compares with conventional clock recovery circuits, which tune their respective VCOs based on the frequency of other VCOs, which themselves often are tuned by a set reference frequency.

The following discussion further describes the operation of the CDR circuit 10 and its continual frequency tuning. As previously discussed herein, the input data signal 12 is a random data signal with a baud rate of ½τ, and is shown in FIG. 2 as the first waveform 62. The first delay block 14 delays the input data signal by τ, and is shown in FIG. 2 as the second waveform 64. The input data signal 12 and the delayed data signal are input to the XNOR gate 16. The output of the XNOR gate 16, which is the gating signal for the gated VCO 28, is shown in FIG. 2 as the third waveform 66. The XNOR gate 16 creates a pulse of time τ for each rising or falling edge of the input data signal 12 (the first waveform 62).

The non-inverting output line 36 of the NAND/AND gate 32 (the positive output Y of the gated VCO 28) represents the recovered clock (RT_CLOCK), and is shown in FIG. 2 as the fourth waveform 68. The inverting output line 38 of the NAND/AND gate 32 (the negative output $Y_b$ of the gated VCO 28) is shown in FIG. 2 as a fifth waveform 69.

When data transitions in the input data signal 12 (the first waveform 62) occur, the output of the XNOR gate 16 (the third waveform 66) is set to a low state for a time τ. This low state drives the positive output Y of the gated VCO 28 to a low state and drives the negative output $Y_b$ of the gated VCO 28 to a high state. After time τ, the output of the XNOR gate 16 returns to a high state, which enables the gated VCO 28. That is, the positive output Y of the gated VCO 28 switches from a low state to a high state, and the negative output $Y_b$ of the gated VCO 28 switches from its high state to a low state.

The rising edge of the positive output Y of the gated VCO 28 is used to re-time the incoming data signal in the center of the input data bit. That is, a data transition will cause the gated VCO 28 to mute for time τ and then cause a rising edge on the positive output Y of the gated VCO 28 that occurs during the center of the data bit in the input data signal, each of which has a duration of 2τ. See, e.g., the dashed line 72 shown in FIG. 2, which shows that a rising edge of the positive output Y of the gated VCO 28 (the fourth waveform 68) occurs at or corresponds to the center of the data bit shown in the input data signal (the first waveform 62). Therefore, in this manner, even during long runs of incoming data signals in either a high state or a low state, the CDR circuit 10 always returns to the gated VCO 28 being enabled.

According to embodiments of the invention, the secondary loop 56 is comprised of the frequency detector 24 and the PLL 53. The secondary loop 56 is used to calibrate the frequency of the CDR circuit 10, if necessary. The PLL 53 provides a reference source having a period of 2τ by scaling the reference frequency (REF_IN) to be equal to ½τ. Alternatively, if a reference source having a period of 2τ is available, such reference source is coupled directly to second input frequency detector 24.

As discussed previously herein, the operation of the gated VCO 28 within the CDR circuit 10 is continuous. Thus, the gated VCO 28 will generate an average frequency. According to embodiments of the invention, when necessary, the frequency detector 24 compares the average frequency of the gated VCO 28 to the reference frequency generated by the PLL 53 or, alternatively, generated by the frequency reference alone. Any frequency deviation is adjusted by controlling the feedback delay of the gated VCO 28, i.e., by adjusting the delay of the second delay block 34. Alternatively, the frequency detector 24 also controls the delay of the first delay block 14, e.g., via the control input 22.

According to embodiments of the invention, as just described, the average frequency of the CDR circuit is controlled, as needed, by the secondary loop 74. Also, according to embodiments of the invention, the instantaneous phase of the CDR circuit 10 and the average clock frequency of the gated VCO 28 is generated by the inventive arrangement of the gated VCO 28, e.g., as shown in FIG. 1 and described hereinabove. Collectively, the gated VCO 28 and the secondary loop 74 provide a relatively robust CID tolerant CDR circuit with the ability to accomplish an instantaneous phase lock to the data input.

According to alternative embodiments of the invention, the calibration or adjustment of the second delay block 34 provides a basis for adjustment of the first delay block 14. For example, the first delay block 14 and the second delay block 34 are designed similarly so that adjustment of both delay blocks can be performed without regard to device environment (e.g., voltage and temp) and lot process variation. In this manner, both delay blocks can be adjusted similarly regardless of process or environment variations.

As discussed previously herein, CDR circuits according to embodiments of the invention include a gated VCO that is continually frequency tuned, which provides a relatively large tolerance to CID. For example, if the tolerance is ±200 ppm (parts per million) for the difference in data frequency and reference frequency, then CDR circuits according to embodiments of the invention have a theoretical CID tolerance of $1/(2*0.0002)=2500$ bits. This CID tolerance compares with a CID tolerance of approximately 16-17 bits in many conventional arrangements.

It will be apparent to those skilled in the art that many changes and substitutions can be made to the embodiments of the invention herein described without departing from the spirit and scope of the invention as defined by the appended claims and their full scope of equivalents. For example, although the circuit components are described hereinabove as an integrated circuit or part of an integrated circuit, the various circuit components alternatively can be discrete components arranged and coupled together to form the various circuits shown and described.

The invention claimed is:

1. An integrated circuit including a clock and data recovery (CDR) circuit, the CDR circuit generating a clock signal based on an input data signal having a period $2\tau$ and including a plurality of data state transitions, the CDR circuit comprising:
   a first delay arrangement for generating a gating signal of duration $\tau$ based on the data state transitions of the input data signal, wherein the first delay arrangement includes a first delay element;
   a gated voltage-controlled oscillator coupled to the first delay arrangement in such a way that the gating signal enables the gated voltage-controlled oscillator, wherein the gated voltage-controlled oscillator, when enabled, generates the clock signal, wherein the generated clock signal has a duration $\tau$ and is synchronized to the center of the data state transitions of the input data signal,
   wherein the gated voltage-controlled oscillator includes a first frequency control loop that continually calibrates the frequency of the gated voltage-controlled oscillator to generate the clock signal with the duration $\tau$, and delays the generated clock signal in such a way that the generated clock signal is synchronized to the center of the data state transitions of the input data signal; and
   a secondary loop coupled to the first frequency control loop of the gated voltage-controlled oscillator and coupled to the first delay element of the first delay arrangement, wherein the secondary loop includes a frequency detector that tunes the first delay element and tunes the first frequency control loop of the gated voltage-controlled oscillator based on the frequency difference between a recovered clock signal output from the gated voltage-controlled oscillator and an output frequency of a phase locked loop coupled to the frequency detector.

2. The integrated circuit as recited in claim 1, wherein the gated voltage-controlled oscillator comprises a NAND/AND gate having a first gating input A, a second input B, a non-inverting output Y and an inverting output $Y_b$, wherein the gated voltage-controlled oscillator is coupled to the first delay arrangement in such a way that the gating signals generated by the first delay arrangement are received by the first gating input A, and wherein the non-inverting output Y generates the clock signal for the gated voltage-controlled oscillator.

3. The integrated circuit as recited in claim 2, wherein the frequency control loop comprises a second delay element coupled between the inverting output $Y_b$ of the NAND/AND gate and the second input B of the NAND/AND gate.

4. The integrated circuit as recited in claim 3, wherein the clock and data recovery circuit further comprises a secondary frequency control loop coupled to the gated voltage-controlled oscillator for adjusting the amount of signal delay in the frequency control loop.

5. The integrated circuit as recited in claim 4, wherein the secondary frequency control loop adjusts the amount of signal delay in the first delay arrangement.

6. The integrated circuit as recited in claim 1, wherein the first delay arrangement comprises a XNOR gate having a first input that receives the input data signal, a second input that is coupled to the first delay element in such a way that the second input of the XNOR gate receives a version of the input data signal that has been delayed by the first delay element, and an output that generates the gating signal, wherein the gating signal has pulses of duration $\tau$ that correspond to data state transitions of the input data signal.

7. The integrated circuit as recited in claim 1, further comprising a data extraction device, wherein the data extraction device has a first input D that receives the input data signal, a second input CLK that receives the generated clock signal, and an output Q that outputs the input data signal based on the generated clock signal received at the second input CLK, wherein the data extraction device synchronizes the input data signal output from the output Q with the generated clock signal received at the second input CLK.

8. The integrated circuit as recited in claim 7, wherein the data extraction device further comprises a master/slave data D flip-flop.

9. The integrated circuit as recited in claim 1, wherein the clock signal generated by the gated voltage-controlled oscillator has an average frequency, and wherein the clock and data recovery circuit further comprises a secondary frequency control loop coupled to the gated voltage-controlled oscillator for calibrating the gated voltage-controlled oscillator.

10. The integrated circuit as recited in claim 9, wherein the secondary frequency control loop generates a reference signal having a reference frequency, wherein the secondary frequency control loop further comprises a frequency detector for comparing the frequency of the reference signal to the average frequency of the clock signal generated by the gated voltage-controlled oscillator, and wherein the secondary frequency control loop calibrates the gated voltage-controlled oscillator based on the comparison of the frequency of the reference signal to the average frequency of the clock signal generated by the gated voltage-controlled oscillator.

11. The integrated circuit as recited in claim 9, wherein the secondary frequency control loop further comprises a phase-locked loop to generate the reference signal.

12. A method for recovering a clock signal from a data signal, wherein the data signal has a period $2\tau$ and includes a plurality of data state transitions, the method comprising the steps of:
   providing the data signal;
   providing a delay arrangement that delays a version of the data signal and uses the data signal and the delayed version of the data signal to generate a gating signal of duration $\tau$ that corresponds to data state transitions of the data signal;
   providing a gated voltage-controlled oscillator that is enabled by the gating signal, wherein the gated voltage-controlled oscillator, when enabled, generates the clock signal, wherein the generated clock signal has a duration $\tau$ and is synchronized to the center of the data state transitions of the data signal;

calibrating the frequency of the gated voltage-controlled oscillator with a first frequency control loop in such a way the clock signal generated by the gated voltage-controlled oscillator has a duration τ and is delayed in such a way that the clock signal remains synchronized to the center of the data state transitions of the data signal; and tuning the delay arrangement and the first frequency control loop with a secondary loop coupled between the gated voltage-controlled oscillator and the delay arrangement, wherein the secondary loop includes a frequency detector that tunes the first delay arrangement and tunes the first frequency control loop of the gated voltage-controlled oscillator based on the frequency difference between a recovered clock signal output from the gated voltage-controlled oscillator and an output frequency of a phase locked loop coupled to the frequency detector.

13. The integrated circuit as recited in claim 12, further comprising the step of adjusting with a second frequency control loop the amount of signal delay in the first frequency control loop.

14. The integrated circuit as recited in claim 13, wherein the gated voltage-controlled oscillator has an average frequency, and wherein the adjusting step adjusts the amount of signal delay in the first frequency control loop based on a comparison of the average frequency of the gated voltage-controlled oscillator with a reference frequency.

15. The integrated circuit as recited in claim 12, further comprising the step of synchronizing the clock signal with the data signal with a data extraction device.

16. The integrated circuit as recited in claim 12, wherein the delay arrangement providing step further comprises the step of applying a logical XNOR operation to the data signal and the delayed version of the data signal to generate the gating signal.

17. An information transmission system, comprising:
a transmitter for generating a data signal, the data signal having a period 2τ and including a plurality of data state transitions;
a transmission medium having a first end coupled to the transmitter and a second end, the transmission medium transmitting the data signal from the transmitter; and
a receiver coupled to the second end of the transmission medium for receiving the data signal generated by the transmitter and transmitted by the transmission medium, the receiver including an integrated circuit having a clock and data recovery circuit, the clock and data recovery circuit generating a recovered clock signal based on the data signal, the clock and data recovery circuit comprising
a first delay arrangement for generating a gating signal that has pulses of duration τ that correspond to data state transitions of the data signal, wherein the first delay arrangement includes a first delay element,
a gated voltage-controlled oscillator coupled to the first delay arrangement in such a way that the gating signal enables the gated voltage-controlled oscillator, wherein the gated voltage-controlled oscillator, when enabled, generates the clock signal, wherein the generated clock signal has a duration τ and is synchronized to the center of the data state transitions of the input data signal,
wherein the gated voltage-controlled oscillator includes a first frequency control loop that continually calibrates the frequency of the gated voltage-controlled oscillator to generate the clock signal with the duration τ, the frequency control loop including a second delay element that delays the generated clock signal by τ in such a way that the generated clock signal is synchronized to the center of the data state transitions of the input data signal, and
a secondary loop coupled to the first frequency control loop of the gated voltage-controlled oscillator and coupled to the first delay element of the first delay arrangement, wherein the secondary loop includes a frequency detector that tunes the first delay element in such a way that the gating signal causes the generated clock signal from the gated voltage-controlled oscillator to remain in the center of the data state transitions of the input data signal and tunes the first frequency control loop of the gated voltage-controlled oscillator in such a way that the frequency of the gated voltage-controlled oscillator matches the frequency of a phase locked loop coupled to the frequency detector, wherein the secondary loop tunes the first delay element and tunes the first frequency control loon of the gated voltage-controlled oscillator based on the frequency difference between a recovered clock signal output from the gated voltage-controlled oscillator and an output frequency of a phase locked loop coupled to the frequency detector.

18. The integrated circuit as recited in claim 17, wherein the clock signal generated by the gated voltage-controlled oscillator has an average frequency, and wherein the CDR circuit further comprises a secondary frequency control loop coupled to the gated voltage-controlled oscillator for adjusting the amount of signal delay by the second delay element based on a comparison of the average frequency of the clock signal generated by the gated voltage-controlled oscillator with a reference frequency.

19. The integrated circuit as recited in claim 18, wherein the secondary frequency control loop generates the reference frequency, and wherein the secondary frequency control loop further comprises a frequency detector for comparing the reference frequency to the average frequency of the clock signal generated by the gated voltage-controlled oscillator.

20. The integrated circuit as recited in claim 18, wherein the secondary frequency control loop further comprises a phase-locked loop to generate the reference frequency.

21. The integrated circuit as recited in claim 17, further comprising a data extraction device coupled to the gated voltage-controlled oscillator that synchronizes the data signal with the clock signal generated from the gated voltage-controlled oscillator.

* * * * *